United States Patent
Iwata (10) Patent No.: US 9,096,186 B2
(45) Date of Patent: Aug. 4, 2015

(54) CASE FOR IN-VEHICLE ELECTRONIC DEVICE AND VEHICLE

(71) Applicant: TOYOTA JIDOSHA KABUSHIKI KAISHA, Toyota-shi, Aichi-ken (JP)

(72) Inventor: Shuichi Iwata, Toyota (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 0 days.

(21) Appl. No.: 14/555,160

(22) Filed: Nov. 26, 2014

(65) Prior Publication Data
US 2015/0151696 A1 Jun. 4, 2015

(30) Foreign Application Priority Data
Nov. 29, 2013 (JP) .................................. 2013-247406

(51) Int. Cl.
*B60R 16/03* (2006.01)
*H05K 5/02* (2006.01)
*B60K 6/22* (2007.10)

(52) U.S. Cl.
CPC . *B60R 16/03* (2013.01); *B60K 6/22* (2013.01); *H05K 5/0217* (2013.01)

(58) Field of Classification Search
CPC ......... B60R 16/03; B60R 6/22; H05K 5/0217
USPC ....................................................... 180/312
See application file for complete search history.

(56) References Cited

U.S. PATENT DOCUMENTS

| | | | | |
|---|---|---|---|---|
| 6,166,498 A | * | 12/2000 | Yamaguchi et al. | ............ 318/34 |
| 6,201,365 B1 | * | 3/2001 | Hara et al. | .................... 318/558 |
| 2005/0006963 A1 | * | 1/2005 | Takenaka et al. | ............... 310/52 |
| 2009/0223695 A1 | | 9/2009 | Inoue et al. | |
| 2013/0220719 A1 | * | 8/2013 | Kobayashi | ................. 180/65.21 |
| 2014/0345960 A1 | * | 11/2014 | Yamanaka et al. | ........... 180/65.8 |

FOREIGN PATENT DOCUMENTS

| | | | |
|---|---|---|---|
| JP | 2000-289540 | | 10/2000 |
| JP | 2001119898 A | * | 4/2001 |
| JP | 2007-284023 | | 11/2007 |
| JP | 2011-218837 | | 11/2011 |
| JP | 2012042010 A | * | 3/2012 |
| WO | WO 2015001408 A2 | * | 1/2015 |

* cited by examiner

*Primary Examiner* — Faye M Fleming
(74) *Attorney, Agent, or Firm* — Finnegan, Henderson, Farabow, Garrett & Dunner, LLP (57) ABSTRACT

A case for an in-vehicle electronic device is placed in an inclined manner on a top face of a transmission such that at least part of a front side of the case is lower than at least side of a rear side of the case. The case includes a first case, a second case and a rib. The first case is configured to be attached to the top face of the transmission. The second case is attached to a top face of the first case. The rib is on a lower part of a rear face of the second case and includes a top face. The rib extends in a crosswise direction along the lower part of the rear face of the second case toward opposite side faces of the second case. The top face of the rib is inclined downward relative to a horizontal plane toward the rear side of the case.

5 Claims, 6 Drawing Sheets

CASE FOR IN-VEHICLE ELECTRONIC DEVICE AND VEHICLE

INCORPORATION BY REFERENCE

The disclosure of Japanese Patent Application No. 2013-247406 filed on Nov. 29, 2013 including the specification, drawings and abstract is incorporated herein by reference in its entirety.

BACKGROUND OF THE INVENTION

1. Field of the Invention

The present invention relates to a case for an electronic device to be provided in an engine room (or a motor room) of a vehicle, and the vehicle.

2. Description of Related Art

Various devices including an engine (or a drive motor) are provided in an engine room of a vehicle. Particularly, in recent years, electric vehicles including hybrid vehicles have been used widely, and the vehicles are equipped with various electronic devices. An inverter for generating an alternating current for driving a drive motor is a typical in-vehicle electronic device. Particularly, as for an important in-vehicle electronic device such as the inverter, various ideas are suggested about how to place the in-vehicle electronic device.

Japanese Patent Application Publication No. 2011-218837 (JP 2011-218837 A) describes a technique to fix an inverter, which is one type of the in-vehicle electronic device, onto a transmission. Note that the transmission is a general term of any of a motor, an engine, and a gear for transmission of a driving force, or a unit of mechanisms including some of them in combination. Some transmissions for an electric vehicle, particularly, a hybrid vehicle, include three shafts extending in parallel in a vehicle crosswise direction. Such a transmission includes therein two motors and a gear for transmitting outputs of power sources (an engine and the motors) to an axle, and three shafts, in total, including output shafts of the two motors and a main shaft of the gear are placed in parallel. On that account, the three shafts are placed so as to be vertices of a triangle when viewed from a shaft axial direction. When the shafts are placed as such, a top face of a housing of the transmission may be inclined. In the transmission of JP 2011-218837 A, the top face is inclined forward, and an inverter for supplying an alternating-current power to the motor is attached to the top face thus inclined. Here, the in-vehicle electronic device is attached to the transmission by use of a case, which is an outer casing for the electronic device.

SUMMARY OF THE INVENTION

Depending on an operating environment of a vehicle, water may invade in an engine room. This causes the water to be attached to devices such as an engine, a motor, an air conditioner, and a transmission placed in the engine room. The outer casing of the inverter of JP 2011-218837 A is constituted by two cases divided into an upper side and a lower side. The upper case is smaller than the lower case. The upper case is attached to a front side of a top face of the lower case, and a partial range of a rear side of the top face of the lower case is exposed. Since the case is fixed to that top face of the transmission of which the front side is lower than the rear side as described earlier, the top face of the lower case is also inclined so that its front side is lower than its rear side. Because of this, water might be accumulated in a step between the exposed top face of the lower case and the upper case. If water remains accumulated in the step for a long term, the case might corrode. The present specification provides a technique to prevent water from being accumulated in a step formed in a surface where two cases are joined to each other (a top face of a lower case).

A case of one aspect of this invention is for an in-vehicle electronic device. The case is placed in an inclined manner on a top face of a transmission such that at least part of a front side of the case is lower than at least part of a rear side of the case. The case includes a first case, a second case and a rib. The first case is configured to be attached to the top face of the transmission. The second case is attached to a top face of the first case. The rib is on a lower part of a rear face of the second case and includes a top face. The rib extends in a crosswise direction along the lower part of the rear face of the second case toward opposite side faces of the second case. The top face of the rib is inclined downward relative to a horizontal plane toward the rear side of the case.

A vehicle of one aspect of this invention comprises a case. The case is arranged in the vehicle such that at least part of the front side of the case is lower than at least part of the rear side of the case. The case is placed in an inclined manner on a top face of a transmission such that at least part of a front side of the case is lower than at least side of a rear side of the case. The case includes a first case, a second case and a rib. The first case is configured to be attached to the top face of the transmission. The second case is attached to a top face of the first case. The rib is on a lower part of a rear face of the second case and includes a top face. The rib extends in a crosswise direction along the lower part of the rear face of the second case toward opposite side faces of the second case. The top face of the rib is inclined downward relative to a horizontal plane toward the rear side of the case.

According to the technique described in the present Invention, in a case for an electronic device, which is attached in an inclined manner in a vehicle up-down direction and is constituted by two components of a lower case and an upper case, it is possible to make water hard to be accumulated on a rear side of a top face of the lower side case.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

A case (hereinafter referred to as "a device case") for an in-vehicle electronic device, described in the present specification, is placed on a top face of a transmission so as to be inclined downward relative to a horizontal plane from a rear side toward a front side, so that at least part of the front side is lower than at least part of the rear side in a vehicle longitudinal direction. In the present specification, it should be noted that expressions such as "front side," "rear face", and "lateral surface" are used for the convenience of the description, but terms of "front," "rear," "crosswise", "upper", and "lower," including the above expressions, are expressions based on a vehicle equipped with the in-vehicle electronic device. The device case includes a first case attached to the top face of the transmission, and a second case attached to a top face of the first case so as to make contact with the first case. A rib extending toward both sides (both ends) of the second case in a crosswise direction is provided in a lower edge of a rear face of the second case. A top face of the rib is inclined downward relative to a horizontal plane toward a vehicle rear side. Further, in the following description, the rib is referred to as a drain rib.

In the above configuration, if no drain rib is provided, a bottom end of a rear face of the second case makes contact with a top face of the first case, so that a hollow is formed by the rear face of the second case and a partial range of a rear side of the top face of the first case, thereby resulting in that water may be accumulated therein. The drain rib is provided along the hollow, so as to prevent water from being accumulated in the hollow. Water flowing through the rear face of the second case flows through a top face of the drain rib toward a rear side of the case. This accordingly makes it possible to prevent water from being accumulated on the top face of the first case and the device case from corroding.

A rear edge of the drain rib may be connected to an upper edge of a rear face of the first case. According to this configuration, the top face of the drain rib makes contact with the rear face of the first case in succession, so that water flowing through the top face of the drain rib flows into the rear face of the first case directly. This makes it possible to prevent water from being accumulated on the top face of the first case. Further, a connection strength of a joint surface between the first case and the second case including the drain rib is improved, thereby making it possible to improve a vibration resistance to vibration from the transmission and to improve impact resistance performance.

In the following case, the rear edge of the top face of the drain rib can prevent water from being accumulated on the top face of the first case, even if the rear edge does not make connect with an upper edge of the rear face of the first case thoroughly. That is, a central part of the rear edge of the drain rib may be placed on the upper edge of the rear face of the first case, and a side end of the rear edge of the drain rib may be placed on an upper edge of a lateral face of the first case. When the drain rib is viewed from above, a distance between the rear edge of the drain rib and the upper edge of the rear face of the first case may be increased gradually from that part of the rear edge of the drain rib which separates from the upper edge of the rear face of the first case to the side end of the rear edge of the drain rib. If this structure is expressed from another viewpoint, both side ends of the top face of the drain rib in a vehicle crosswise direction are inclined outwardly in the vehicle crosswise direction and downward relative to the horizontal plane. If the drain rib has the above structure, since the top face of the first case is inclined forward, water drops attached to a partial range of the rear side of the top face of the first case reaches the rear edge of the drain rib, and is then discharged from the lateral side of the first case via the rear edge of the drain rib.

Further, the drain rib may be placed generally in a center of the upper edge of the rear face of the first case in the vehicle crosswise direction when viewed from the vehicle rear side and may be configured in a symmetric manner. According to this configuration, since the drain rib is placed in the center of the upper edge of the rear face of the first case, it is possible to uniformalize vibration to be input into the device case, thereby making it possible to improve the vibration resistance.

Figure 1:
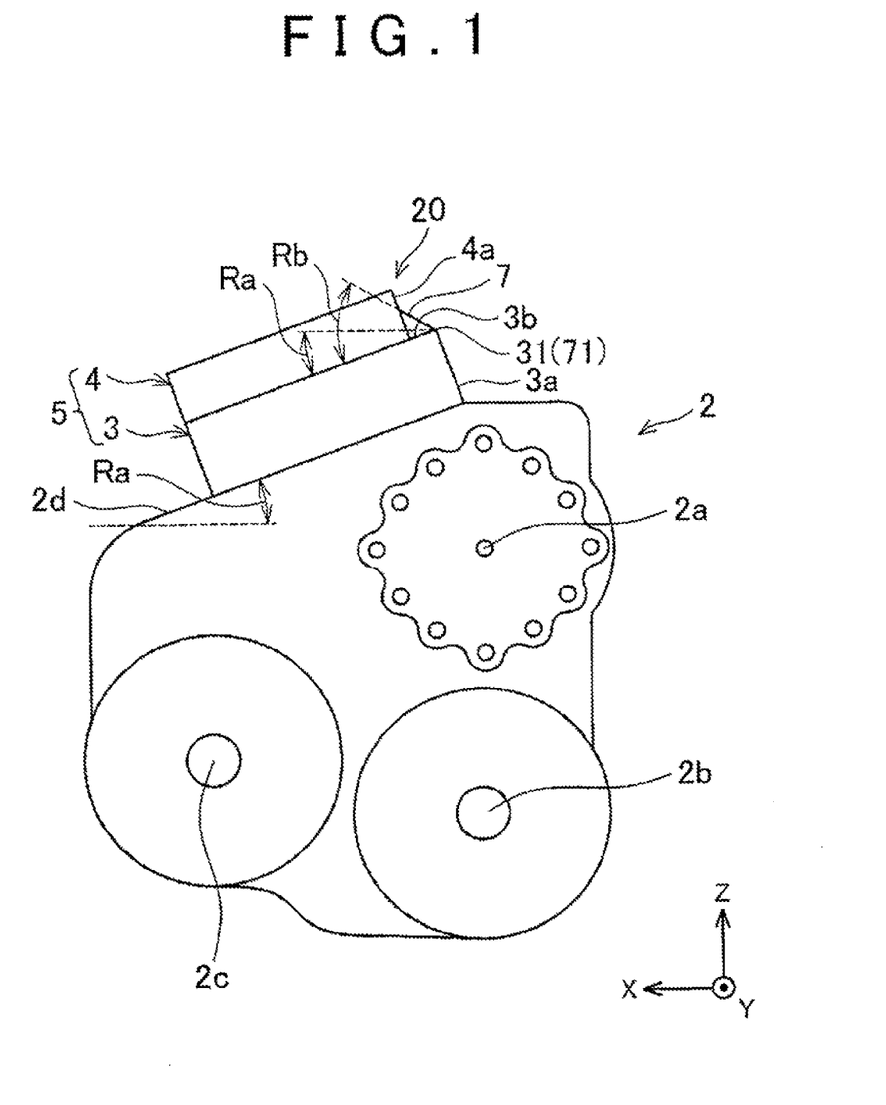
FIG. 1 is a side view of a case for an in-vehicle electronic device and a transmission, according to a first embodiment.
Figure 2:
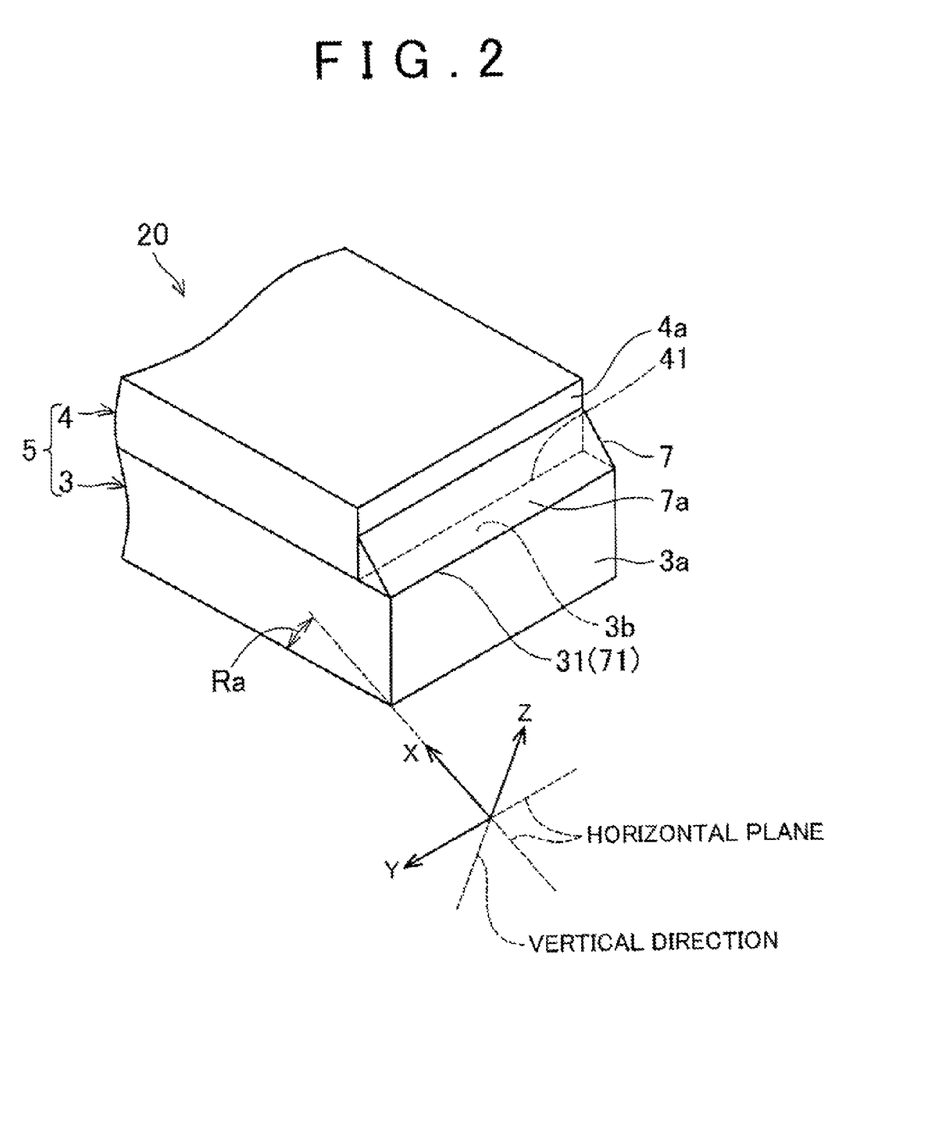
FIG. 2 is a perspective view of the case for an in-vehicle electronic device according to the first embodiment when viewed from its rear side.

A case for an in-vehicle electronic device according to a first embodiment is described with reference to the drawings. The case for an in-vehicle electronic device of this embodiment is a case for a power unit integrally including an inverter and a DC/DC converter (a voltage converter). The case is fixed to a top face of a transmission of a hybrid vehicle. The transmission is placed in an engine room of the hybrid vehicle. In the present embodiment, a device case is an example of the case. FIGS. 1, 2 illustrate a device case 5, which is an outer casing of a power unit 20 fixed to a top face 2d of a transmission 2. A drain rib 7 is provided on a rear side of the device case 5. It should be noted that shapes of the transmission 2 and the device case 5 are simplified in FIGS. 1, 2. In FIG. 2, the transmission 2 placed under the power unit 20 is omitted. Further, an X-axis in the figure corresponds to a vehicle longitudinal direction, and a Y-axis corresponds to a vehicle crosswise direction. A Z-axis corresponds to a vehicle up-down direction, and a vertical direction in a case where the vehicle is placed without being inclined relative to a horizontal direction. Here, a plane formed by the X-axis and the Y-axis is a horizontal plane (hereinafter referred to as an XY plane) when the vehicle is placed without being inclined relative to the horizontal direction. Note that expressions such as "lateral face of the case" and "rear face of the case" indicate "front," "rear," "crosswise (lateral side)," "upper," and "rear" based on the vehicle. Further, in order to help understanding of a shape of the drain rib 7, FIG. 2 illustrates the power unit 20 in an inclined manner with respect to the Z-axis corresponding to the vertical direction. Further, the layout of the transmission in the engine room of the vehicle will be described later with reference to FIG. 3.

As illustrated in FIG. 1, a top face 2d of the transmission 2 is inclined relative to the horizontal plane (the XY plane) due to triangular arrangement of three shafts ($2a$, $2b$, $2c$) so that a positive-direction side of the X-axis (a vehicle front side) is lower than a negative-direction side of the X-axis (a vehicle rear side). An angle Ra of the top face 2d inclined relative to the horizontal plane is about 20 degrees, for example. The shafts $2a$, $2b$ are main shafts of two motors provided in the transmission 2, and the shaft $2c$ is a main shaft of a gear or the like for transmitting an output from the motors to an axle. Here, the transmission 2 may be referred to as a power train or a transaxle. A description on a detailed structure of the transmission 2 is omitted. Note that the motors provided in the transmission 2 may have a function to convert a deceleration energy (regeneration energy) at the time of braking, into an electrical energy.

The device case 5, which is an outer casing of the power unit 20, is placed on a top face 2d in an inclined manner so that its front side is lower than its rear side. An inclination angle of the device case 5 with respect to the horizontal plane is equal to the inclination angle Ra of the top face 2d. The device case 5 includes a converter case 3 and an inverter case 4, which are divided into an upper side and a lower side. A DC/DC converter is accommodated in the converter case 3, and an inverter for converting a direct-current power into an alternating-current power is accommodated in the inverter case 4. The DC/DC converter reduces a voltage of an output power of a high-voltage battery, so as to supply an electric power to accessories such as a car navigation system. The converter case 3 is attached to the top face 2*d* of the transmission 2, and the inverter case 4 is attached to a top face of the converter case 3.

The inverter case 4 is smaller than the converter case 3, and is attached to a front side of the top face of the converter case 3. More specifically, the inverter case 4 is attached to the converter case 3 so that a lower edge of a front face of the inverter case 4 is aligned with an upper edge of a front face of the converter case 3. Accordingly, if the drain rib 7 (described later, more specifically) provided in a rear face 4*a* of the inverter case 4 is not provided, a partial region 3*b* of a rear side of a top face of the converter case 3 is exposed.

FIG. 2 is a perspective view of the device case 5 when viewed from its diagonal rear side. The drain rib 7 is provided in a lower part of the rear face 4*a* of the inverter case 4. The drain rib 7 extends along the bottom end 41 from one end of the inverter case 4 to the other end thereof in the vehicle crosswise direction. A top face 7*a* of the drain rib 7 is inclined from the rear face 4*a* of the inverter case 4 toward an upper edge 31 of a rear face 3*a* of the converter case 3, and a rear edge 71 of the drain rib 7 is connected to the upper edge 31 of the rear face 3*a*. In other words, the top face 7*a* is inclined downward relative to the horizontal plane (the XY plane in the view) toward the vehicle rear side. This indicates that an angle Rb formed between the top face 7*a* of the drain rib 7 and the top face of the converter case 3 is larger than the inclination angle Ra of the device case 5 (see FIG. 1).

A feature of the device case 5 of the present embodiment is as follows. In a rear face (a surface placed on the vehicle rear side) of the device case 5, the rear face 4*a* of the inverter case 4, the top face 7*a* of the drain rib 7, and the rear face 3*a* of the converter case 3 are connected in succession, and these surfaces are continued from an upper side of the device case 5 toward a lower side of the device case 5 so as to be perpendicular to the horizontal plane or to be inclined downward relative to the horizontal plane from a front side to a rear side. Accordingly, water falling from above the device case 5 flows through the inclined top face 7*a* of the drain rib 7, and is then discharged toward the lower side of the device case 5. If the drain rib 7 is not provided, the partial region 3*b* of the rear side of the top face of the converter case 3 is exposed, so that water might be accumulated in a connection part between the partial region 3*b* and the rear face 4*a* of the inverter case 4. However, in the case 5 of the present embodiment, the partial region 3*b* of the rear side of the top face of the converter case 3 is covered with the drain rib 7, so that water is not accumulated in the partial region 3*b*.

Figure 3:
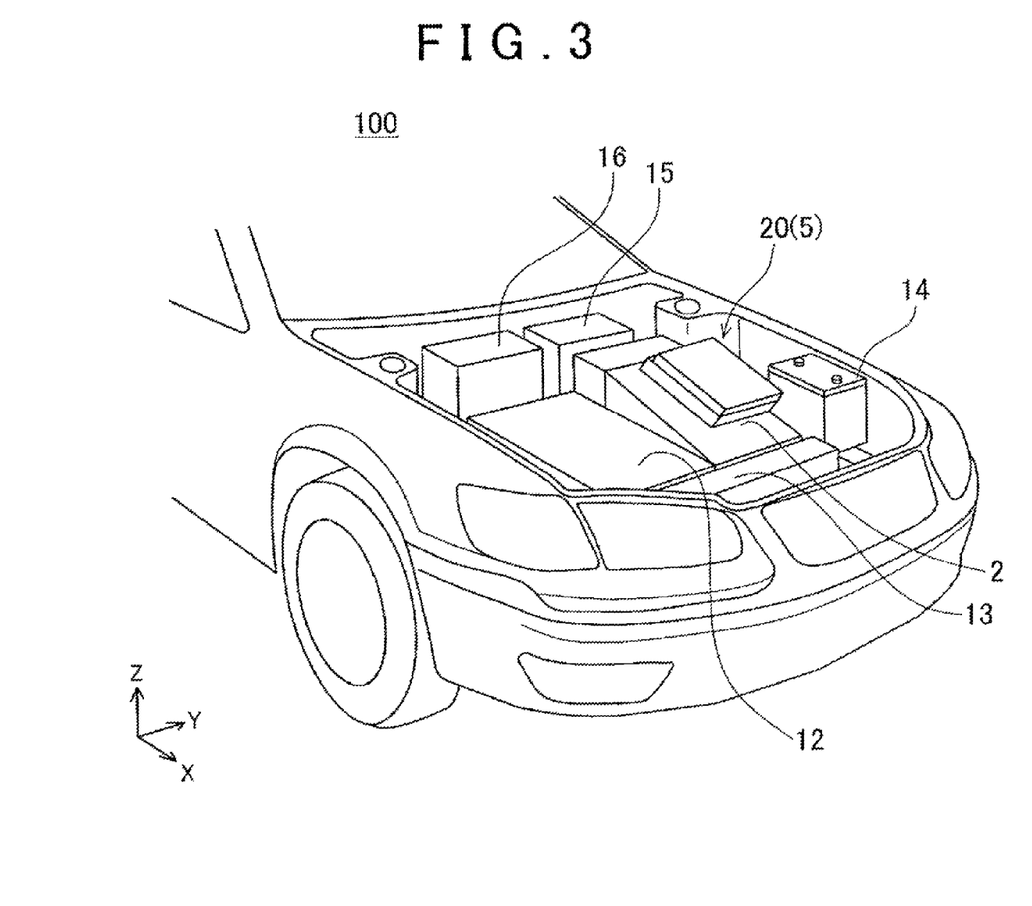
FIG. 3 is a perspective view illustrating a device layout in an engine room of a hybrid vehicle equipped with a transmission including, on its top face, the case for an in-vehicle electronic device according to the embodiments.

Referring now to FIG. 3, a device layout in an engine room of a hybrid vehicle 100 including the power unit 20 (the device case 5) placed on the top face of the transmission 2 is described. As illustrated in FIG. 3, main devices provided in the engine room are an engine 12, a transmission 2, a radiator 13, a sub battery 14, and the power unit 20 placed on a top face of the transmission 2. In addition, a reference sign 15 indicates a compressor for an air conditioner, and a reference sign 16 indicates a relay box. As well illustrated in FIG. 3, the top face of the transmission 2 is inclined so that its front side (a front side in the vehicle longitudinal direction) is lower than its rear side (a rear side in the vehicle longitudinal direction), and the power unit 20 is attached thereon. The power unit 20 is inclined so that its front side is lower than its rear side, along with the top face of the transmission 2. Note that, from a direction where FIG. 3 is viewed perspectively, the drain nib 7 provided on the rear face of the device case 5 is not observable.

Figure 4:
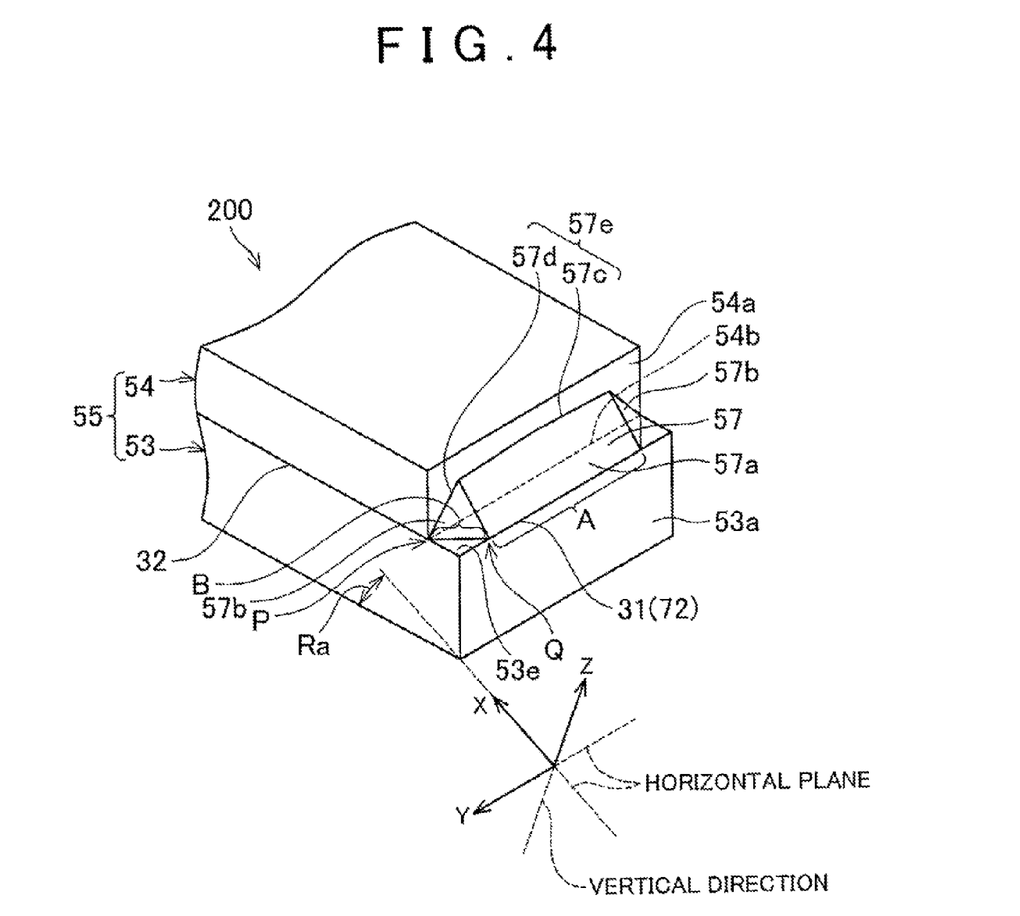
FIG. 4 is a perspective view of a case for an in-vehicle electronic device according to a second embodiment when viewed from its rear side.

A device case 55 of a second embodiment is described. The device case 55 corresponds to a housing for a power unit 200 having an inverter and a converter, similarly to the device case 5 of the first embodiment. Similarly to the device case 5 of the first embodiment, the device case 55 is fixed to that top face of the transmission which is inclined forward. That is, the layout of FIG. 1 and FIG. 3 is just applicable to the device case 55. FIG. 4 is a perspective view of the device case 55 when viewed from its rear side. Similarly to FIG. 2, in FIG. 4, a plane formed by an X-axis and a Y-axis indicates a horizontal plane and the power unit 200 is illustrated in such a manner that a Z-axis corresponding to the vertical direction is inclined.

The device case 55 is also constituted by a converter case 53 and an inverter case 54, which are divided into an upper side and a lower side. A DC/DC converter is accommodated in the converter case 53, and an inverter for converting a direct-current power into an alternating-current power is accommodated in the inverter case 54.

The device case 55 is different from the device case 5 of the first embodiment in a shape of a drain rib 57, and the other configurations are the same as those in the device case 5 of the first embodiment. The following describes the shape of the drain rib 57.

A top face of the drain rib 57 is divided into a first inclined top face 57*a* and second inclined top faces 57*b*. The first inclined top face 57*a* extends from a rear face 54*a* of the inverter case 54 toward a vehicle rear side, and is inclined downward relative to the horizontal plane. The second inclined top faces 57*b* are connected to both ends of the first inclined top face 57*a* in a Y-axis direction, and are inclined outwardly in the vehicle crosswise direction and downward relative to the horizontal plane.

From another viewpoint, a longitudinal sectional shape of the drain rib 57 viewed from the Y-axis direction is a triangular shape having a slanted line that is inclined from the rear face 54*a* toward an upper edge 31 of a rear face 53*a* of the converter case 53. Further, a shape viewed from the vehicle rear side is a symmetrical shape and is a generally trapezoidal shape in which a side corresponding to the first inclined top face 57*a* is assumed an upper hem 57*c*, and lateral sides (upper hems 57*d*) thereof are inclined from both ends of the upper hem 57*c* toward upper edges of both lateral faces of the converter case 53. Note that a line including the upper hem 57*c* and the upper hems 57*d* corresponds to an upper edge 57*e* of the drain rib 57. The upper edge 57*e* is configured such that the upper hems 57*d* of the second inclined top faces 57*b* are continuous with both ends of the upper hem 57*c* of the first inclined top face 57*a*, and the upper hems 57*d*, which are part of the upper edge 57*e*, are inclined toward the upper edges of both lateral faces of the converter case 53. That is, the upper edge 57*e* has a shape widening toward the lower side. Further, in other words, the surfaces (the second inclined top faces 57*b*) on both sides of the top face of the drain rib 57 in the vehicle crosswise direction are inclined outwardly in the vehicle crosswise direction and downward relative to the horizontal plane.

A rear edge 72 of the drain rib 57 is connected to the top face of the converter case 53. A central part (a range indicated by a reference sign A) of the rear edge 72 is placed on an upper edge 31 of a rear face 53*a* of the converter case 53. Further, side ends of the rear edge 72 are placed on upper edges 32 of the lateral faces of the converter case 53 (a part indicated by a reference sign P). Further, when viewed from above, a distance between the rear edge 72 of the drain rib 57 and the upper edge 31 is gradually increased (a range indicated by a range B) from a part where the rear edge 72 of the drain rib 57 separates from the upper edge 31 of the rear face 53a of the converter case 53, to the side end of the rear edge of the drain rib 57.

A feature of the device case 55 of the second embodiment is as follows. In a rear face (a surface placed on the vehicle rear side) of the device case 55, the rear face 54a of the inverter case 54, the inclined top faces 57a, 57b of the drain rib 57, and the rear face 53a of the converter case 53 are connected in succession, and these surfaces are successively inclined downward relative to the horizontal plane, from an upper side of the device case 55 toward a lower side of the device case 55. The central part (the range indicated by the reference sign A in the figure) of the rear edge 72 of the drain rib 57 is connected to the upper edge 31 of the rear face 53a of the converter case 53, and both side ends of the rear edge 72 are connected to the upper edge 32 of the lateral faces of the converter case 53 (the part indicated by the reference sign P in the figure). Further, when the drain rib 57 is viewed from above, on both sides of the central part, the distance between the rear edge 72 of the drain rib 57 and the upper edge 31 of the rear face 53a of the converter case 53 is gradually increased (the range indicated by the reference sign B) from the part (a part indicated by a reference sign Q in the figure) where the rear edge 72 of the drain rib 57 separates from the upper edge 31 of the converter case 53, to the end (the part indicated by the reference sign P in the figure) of the rear edge of the drain rib 57.

According to such a configuration, water falling from above the device case 55 flows through the inclined top faces 57a, 57b of the drain rib 57, and is then discharged toward the lower side of the device case 55. Note that a part 53e of the top face of the converter case 53 is exposed. In this regard, the rear edge 72 of the drain rib 57 is connected to the part 53e of the top face, and extends from the upper edge 31 of the rear face 53a to the upper edge 32 on the lateral face (the range indicated by the reference sign B). According to such a configuration, water flows along the rear edge 72 in the range indicated by the reference sign B, and then falls down from that side end of the reat edge 72 which is indicated by the reference sign P toward the lateral side of the converter case 53. Water that falls on the part 53e of the top face through the second inclined top face 57b of the drain rib 57 also falls down from that side end of the rear edge 72 which is indicated by the reference sign P toward the lateral side of the converter case 53.

Figure 5:
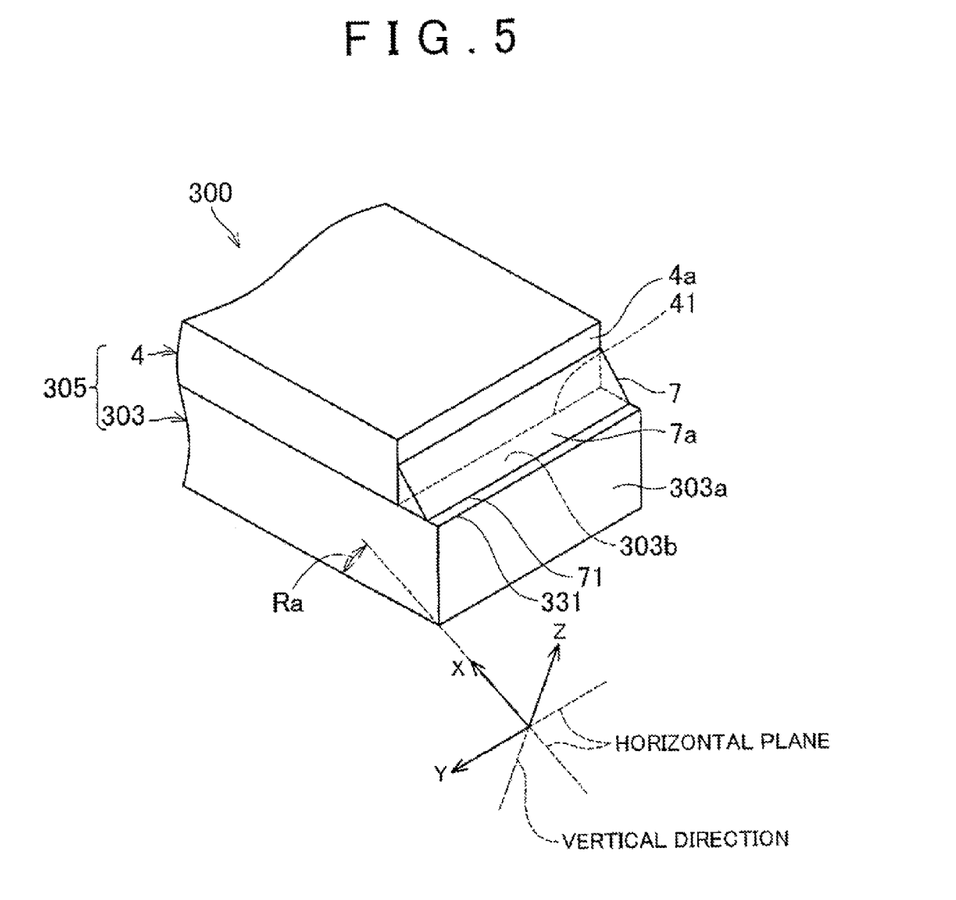
FIG. 5 is a perspective view illustrating a modified embodiment of the first embodiment.

The following describes a modified embodiment of the first embodiment, as illustrated in FIG. 5. A device case 305 corresponds to a housing of a power unit 300 having an inverter and a converter, similarly to the device case 5 of the first embodiment. In the device case 305, an upper edge 331 of a rear face 303a of a converter case 303 is placed on a vehicle rear side relative to a rear edge 71 of a drain rib 7. That is, the rear edge 71 of the drain rib 7 is placed on a top face 303b of the converter case 303, and the upper edge 331 is not connected to the rear edge 71. Even in such a configuration, water falling from above the device case 305 flows through an inclined top face 7a of the drain rib 7 toward a rear side of the device case 305, thereby making it possible to prevent the water from being accumulated on the rear side of the device case 305. Note that configurations other than a positional relationship between the converter case 303 and the inverter case 4 are the same as the first embodiment. Further, the layout of FIG. 1 and FIG. 3 is just applicable to the device case 305.

Figure 6:
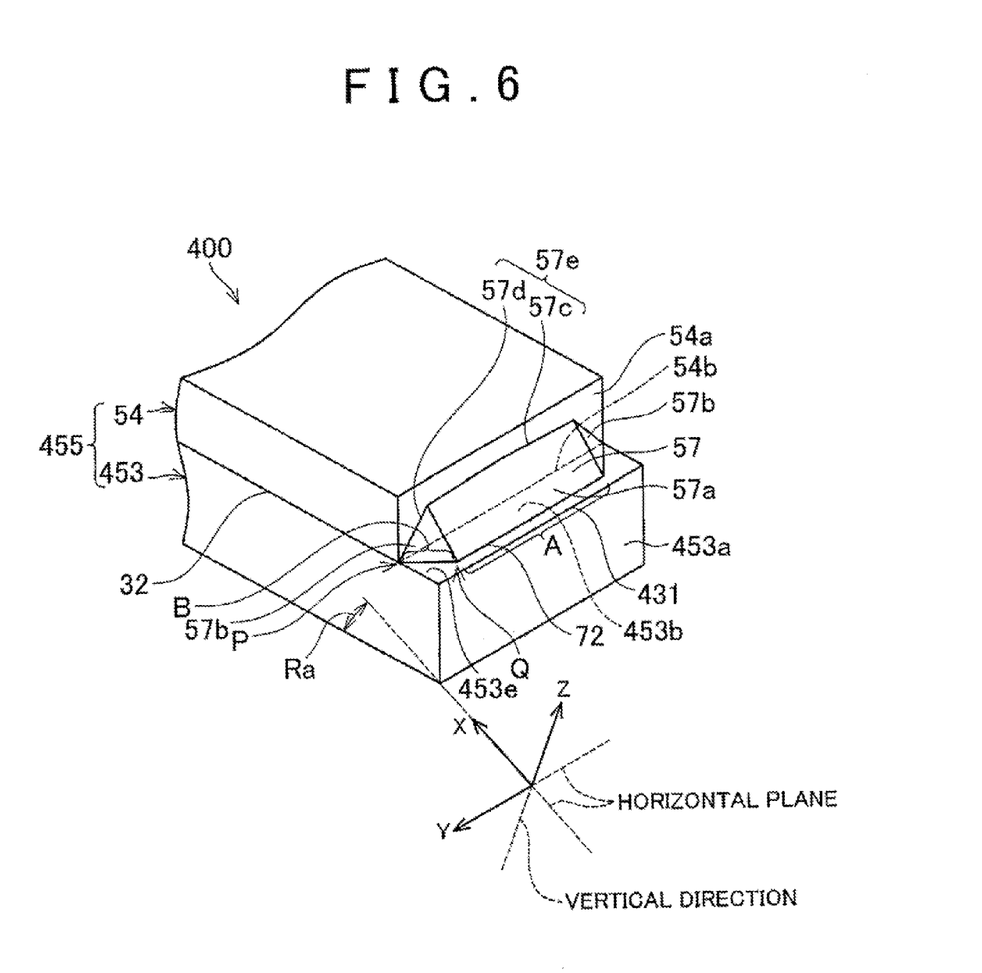
FIG. 6 is a perspective view illustrating a modified embodiment of the second embodiment.

Further, the following describes a modified embodiment of the second embodiment, as illustrated in FIG. 6. Similarly to the second embodiment, a device case 455 corresponds to a housing of a power unit 400. In the device case 455, an upper edge 431 of a rear face 453a of a converter case 453 is placed on a vehicle rear side relative to a rear edge 72 of a drain rib 57, similarly to the above device case 305. That is, a central part A of the rear edge 72 of the drain rib 57 and edge, indicated by a reference sign B, extending from both ends thereof are placed on a top face 453b of the converter case 453, and the upper edge 431 and the rear edge 72 are not connected to each other. Even in such a configuration, water falling from above the device case 455 flows through an inclined top face 57a of the drain rib 57 toward a rear side of the device case 455, and also flows through the edges, indicated by the reference sign B, of the rear edge 72 of the drain rib 57 toward lateral sides of the device case 455. This makes it possible to prevent water from being accumulated on the rear side of the device case 455. Note that configurations other than a positional relationship between the converter case 453 and an inverter case 54 are the same as the second embodiment. Further, the layout of FIG. 1 and FIG. 3 is just applicable to the device case 455.

As described above, since the device cases according to the first, second embodiments include the drain rib on the lower edge of the rear face of the inverter case on the upper side, it is possible to prevent water from being accumulated on the top face of the converter case. Further, since the drain rib is provided in a center of the lower edge of the rear face of the inverter case in a symmetrical manner, it is possible to uniformalize vibration to be transmitted to the device case, thereby making it possible to increase a vibration resistance characteristic.

The following describes a point to keep in mind in regard to the technique described in the above embodiments. The power units 20, 200, 300, 400 are examples of the "electronic device." The converter cases 3, 53, 303, 453 are examples of the "first case," and the inverter cases 4, 54 are examples of the "second case." The drain ribs 7, 57 are examples of the "rib."

The upper hem 57c of the first inclined top face 57a of the drain rib 57 of the second embodiment may have a shape widening and inclined toward the lower side of the device case 55 with its center as a vertex. According to this configuration, water falling toward the upper hem 57c flows toward both side ends of the upper hem 57c, thereby making it possible to further effectively discharge the water toward the lower side of the device case 55.

Further, the upper hem 7c of the drain rib 7 may be connected to the top face of the inverter case 4. Even with the configuration, it is possible to further effectively discharge water toward the lower side of the device case 55, similarly to the above. Further, this can increase strength of the drain rib 7, so that it is possible to further improve a vibration resistance.

The concrete embodiments of the invention have been described in detail, but these embodiments are only examples and do not limit the invention according to claims. A technique according to claims includes embodiments obtained by variously modifying or altering the concrete embodiments exemplified as above. Technical elements described in the present specification or the drawings exhibit a technical usability solely or in various combinations, and are not limited to combinations as described in claims as of filing the present application. Further, the technique exemplified in the present specification or the drawings can achieve a plurality of objects at the same time, and has a technical usability by achieving one of those objects.

What is claimed is:

1. A case for an in-vehicle electronic device, to be placed in an inclined manner on a top face of a transmission such that at least part of a front side of the case is lower than at least part of a rear side of the case, the case comprising:
- a first case configured to be attached to the top face of the transmission;
- a second case attached to a top face of the first case; and
- a rib on a lower part of a rear face of the second case, the rib including a top face,
- wherein the rib extends in a crosswise direction along the lower part of the rear face of the second case toward opposite side faces of the second case, and
- the top face of the rib is inclined downward relative to a horizontal plane toward the rear side of the case.

2. The case according to claim 1, wherein:
a rear edge of the rib is connected to an upper edge of a rear face of the first case.

3. The case according to claim 1, wherein:
- a central part of a rear edge of the rib is placed on an upper edge of a rear face of the first case;
- a side end of the rear edge of the rib is placed on an upper edge of a lateral face of the first case; a distance between the rear edge of the rib and the upper edge of the rear face of the first case gradually increases from a first point to a second point;
- the first point is defined where the rear edge of the rib separates from the upper edge of the rear face of the first case; and
- the second point is defined by the side end of the rear edge of the rib.

4. The case according to claim 1, wherein:
both ends of the top face of the rib are inclined outwardly in the crosswise direction and are inclined downward relative to the horizontal plane.

5. A vehicle comprising a case,
wherein the case is arranged in the vehicle such that at least part of the front side of the case is lower than at least part of the rear side of the case,
the case is placed in an inclined manner on a top face of a transmission, the case includes:
- a first case configured to be attached to the top face of the transmission;
- a second case attached to a top face of the first case; and
- a rib on a lower part of a rear face of the second case, the rib including a top face,
- wherein the rib extends in a crosswise direction along the lower part of the rear face of the second case toward opposite side faces of the second case, and
- the top face of the rib is inclined downward relative to a horizontal plane toward the rear side of the case.

* * * * *